United States Patent
Lin et al.

(10) Patent No.: US 10,439,574 B2
(45) Date of Patent: Oct. 8, 2019

(54) DOWN-CONVERSION MIXER

(71) Applicant: NATIONAL CHI NAN UNIVERSITY, Puli, Nantou (TW)

(72) Inventors: Yo-Sheng Lin, Nantou (TW); Ching-Chiang Chen, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 0 days.

(21) Appl. No.: 16/030,676

(22) Filed: Jul. 9, 2018

(65) Prior Publication Data
US 2019/0207572 A1 Jul. 4, 2019

(30) Foreign Application Priority Data
Jan. 4, 2018 (TW) .............................. 107100324 A

(51) Int. Cl.
*H03D 7/14* (2006.01)
*H03F 3/45* (2006.01)
*H03F 3/193* (2006.01)

(52) U.S. Cl.
CPC ....... *H03F 3/45269* (2013.01); *H03D 7/1441* (2013.01); *H03F 3/193* (2013.01); *H03F 3/45264* (2013.01); *H03F 2200/06* (2013.01); *H03F 2200/451* (2013.01); *H03F 2203/45318* (2013.01); *H03F 2203/45352* (2013.01)

(58) Field of Classification Search
CPC .. H03F 3/45269; H03F 3/45264; H03F 3/193; H03F 2200/06; H03F 2203/45352; H03F 2200/451; H03F 2203/45318; H03D 7/1441; H03D 7/1458
See application file for complete search history.

(56) References Cited

U.S. PATENT DOCUMENTS

| 7,554,381 B2 * | 6/2009 | Belot | H03D 7/1441 327/355 |
| 8,018,267 B2 * | 9/2011 | Kang | H03D 7/1441 327/355 |
| 2017/0207749 A1 * | 7/2017 | Lin | H03D 7/1441 |

* cited by examiner

*Primary Examiner* — Jung Kim
(74) *Attorney, Agent, or Firm* — Womble Bond Dickinson (US) LLP

(57) ABSTRACT

A down-conversion mixer includes a trans conductance circuit and a mixing circuit. The transconductance circuit includes: first and second transconductance units cooperatively converting a differential input voltage signal pair into a differential input current signal pair; and an inductor coupled between the first and second transconductance units. The mixing circuit is coupled to a common node of the first trans conductance unit and the inductor and to a common node of the second transconductance unit and the inductor for receiving the differential input current signal pair therefrom, and mixes the differential input current signal pair with a differential oscillatory voltage signal pair to generate a differential mixed voltage signal pair.

10 Claims, 4 Drawing Sheets

DOWN-CONVERSION MIXER

CROSS-REFERENCE TO RELATED APPLICATION

This application claims priority of Taiwanese Patent Application No. 107100324, filed on Jan. 4, 2018.

FIELD

The disclosure relates to a mixer, and more particularly to a down-conversion mixer.

BACKGROUND

Referring to FIG. 1, a conventional down-conversion mixer includes a first single-ended to differential converting circuit 11, a second single-ended to differential converting circuit 12, a transconductance circuit 13, a mixing circuit 14 and a buffering circuit 15.

The first single-ended to differential converting circuit 11 converts a single-ended oscillatory voltage signal into a differential oscillatory voltage signal pair. The second single-ended to differential converting circuit 12 converts a single-ended input voltage signal of radio frequency into a differential input voltage signal pair. The transconductance circuit has two transistors 131, 132 and converts the differential input voltage signal pair into a differential input current signal pair. The mixing circuit 14 has two resistors 141, 142 and four transistors 143-146, and mixes the differential input current signal pair with the differential oscillatory voltage signal pair to generate a differential mixed voltage signal pair of intermediate frequency. The buffering circuit 15 buffers the differential mixed voltage signal pair to generate a differential output voltage signal pair.

A conversion gain (CG) of a combination of the transconductance circuit 13 and the mixing circuit 14 can be expressed by the following equation:

$$CG = \frac{2}{\pi} \cdot g_{m1,2} \cdot R_{1,2} \cdot \left(\frac{1}{1 + s/\omega_0}\right), \quad \text{Equation 1}$$

where $g_{m1,2}$ denotes a transconductance of each of the transistors 131, 132, $R_{1,2}$ denotes a resistance of each of the resistors 141, 142, $$\omega_0 \approx \frac{G_{m,LO} + 1/R_{ds1,2}}{C_{ds1,2} + C_{LO}},$$

$G_{m,LO}$ denotes an equivalent transconductance seen into each of a combination of the transistors 143, 144 and a combination of the transistors 145, 146 from a common node of each of the combinations, $R_{ds1,2}$ denotes a resistance provided between a drain terminal and a source terminal of each of the transistors 131, 132, $C_{ds1,2}$ denotes a parasitic capacitance provided between the drain terminal and the source terminal of each of the transistors 131, 132, and $C_{LO}$ denotes a parasitic capacitance provided by each of the combination of the transistors 143, 144 and the combination of the transistors 145, 146 at the common node of each of the combinations.

It is known from Equation 1 that the parasitic capacitances ($C_{ds1,2}$, $C_{LO}$) of the transistors 131, 132, 143-146 reduce the conversion gain of the combination of the transconductance circuit 13 and the mixing circuit 14, thereby reducing a conversion gain of the conventional down-conversion mixer and increasing a noise figure of the conventional down-conversion mixer. It is also known from Equation 1 that the conversion gain of the combination of the transconductance circuit 13 and the mixing circuit 14 can be boosted by increasing the resistance ($R_{1,2}$) of each of the resistors 141, 142. However, when the resistance ($R_{1,2}$) of each of the resistors 141, 142 is sufficiently large (e.g., greater than 1000 Ω) such that a voltage drop across each of the resistors 141, 142 is sufficiently large and that a voltage at a drain terminal of each of the transistors 143-146 is sufficiently low, the conversion gain of the combination of the transconductance circuit 13 and the mixing circuit 14 would be reduced instead.

SUMMARY

Therefore, an object of the disclosure is to provide a down-conversion mixer that can alleviate at least one drawback of the prior art.

According to the disclosure, the down-conversion mixer includes a transconductance circuit and a mixing circuit. The transconductance circuit includes a first transconductance unit, a second transconductance unit and an inductor. The first transconductance unit is for receiving a first input voltage signal, and converts the first input voltage signal into a first input current signal. The second transconductance unit is for receiving a second input voltage signal that cooperates with the first input voltage signal to constitute a differential input voltage signal pair, and converts the second input voltage signal into a second input current signal that cooperates with the first input current signal to constitute a differential input current signal pair. The inductor is coupled between the first and second trans conductance units. The mixing circuit is for receiving a differential oscillatory voltage signal pair, and is coupled to a common node of the first transconductance unit and the inductor and to a common node of the second transconductance unit and the inductor for receiving the differential input current signal pair therefrom. The mixing circuit mixes the differential input current signal pair with the differential oscillatory voltage signal pair to generate a differential mixed voltage signal pair.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that throughout the disclosure, each current signal may have a positive magnitude or a negative magnitude, with the positive and negative magnitudes indicating opposite directions of the current signal. For example, when a component receives a current signal with the positive magnitude, the current signal flows into the component; and when the component receives the current signal with the negative magnitude, the current signal flows out of the component. Moreover, it should be noted that throughout the drawings, the direction of each current signal is shown by a corresponding arrow.

Figure 1:
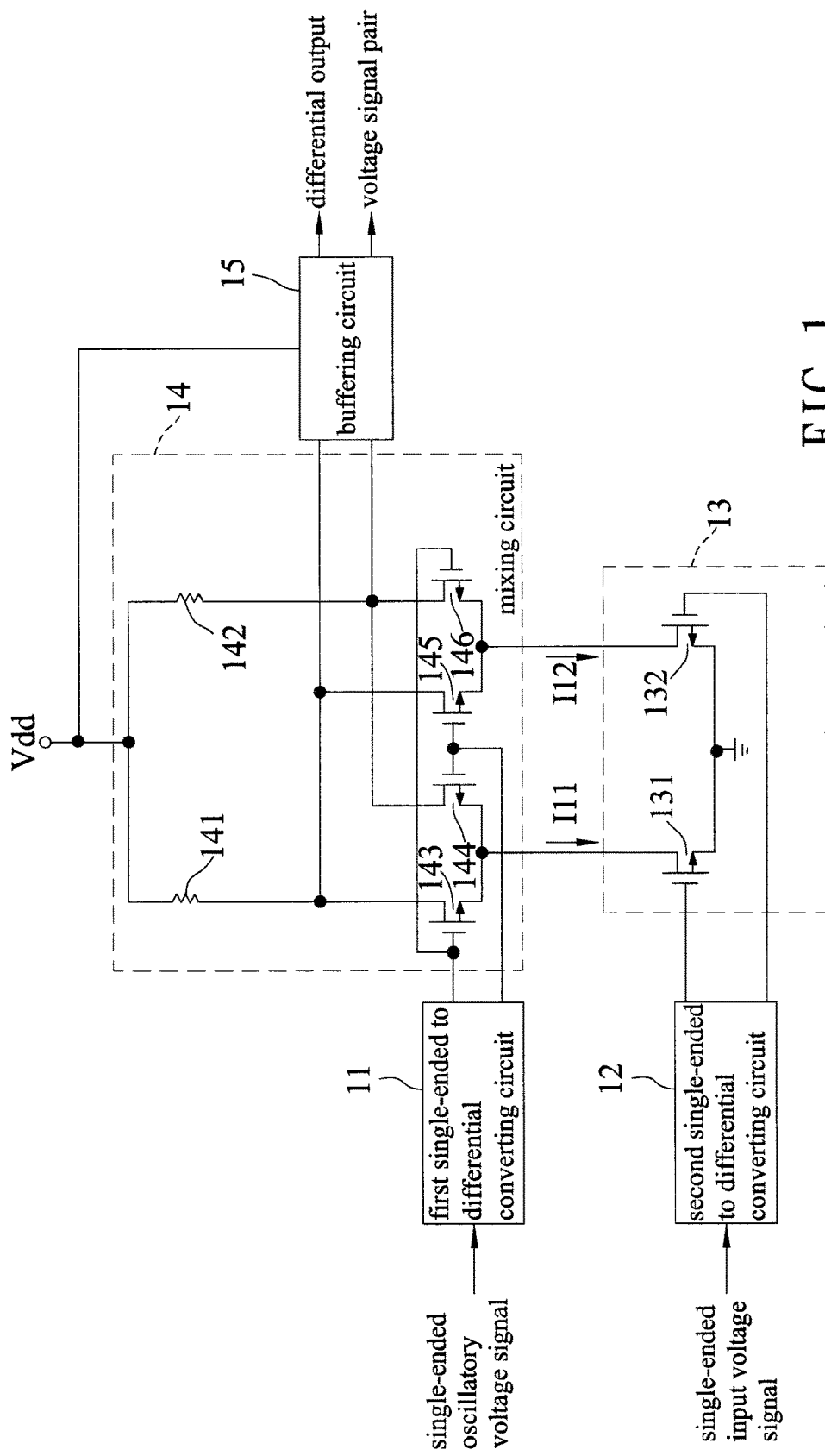
FIG. 1 is a circuit block diagram illustrating a conventional down-conversion mixer.
Figure 2:
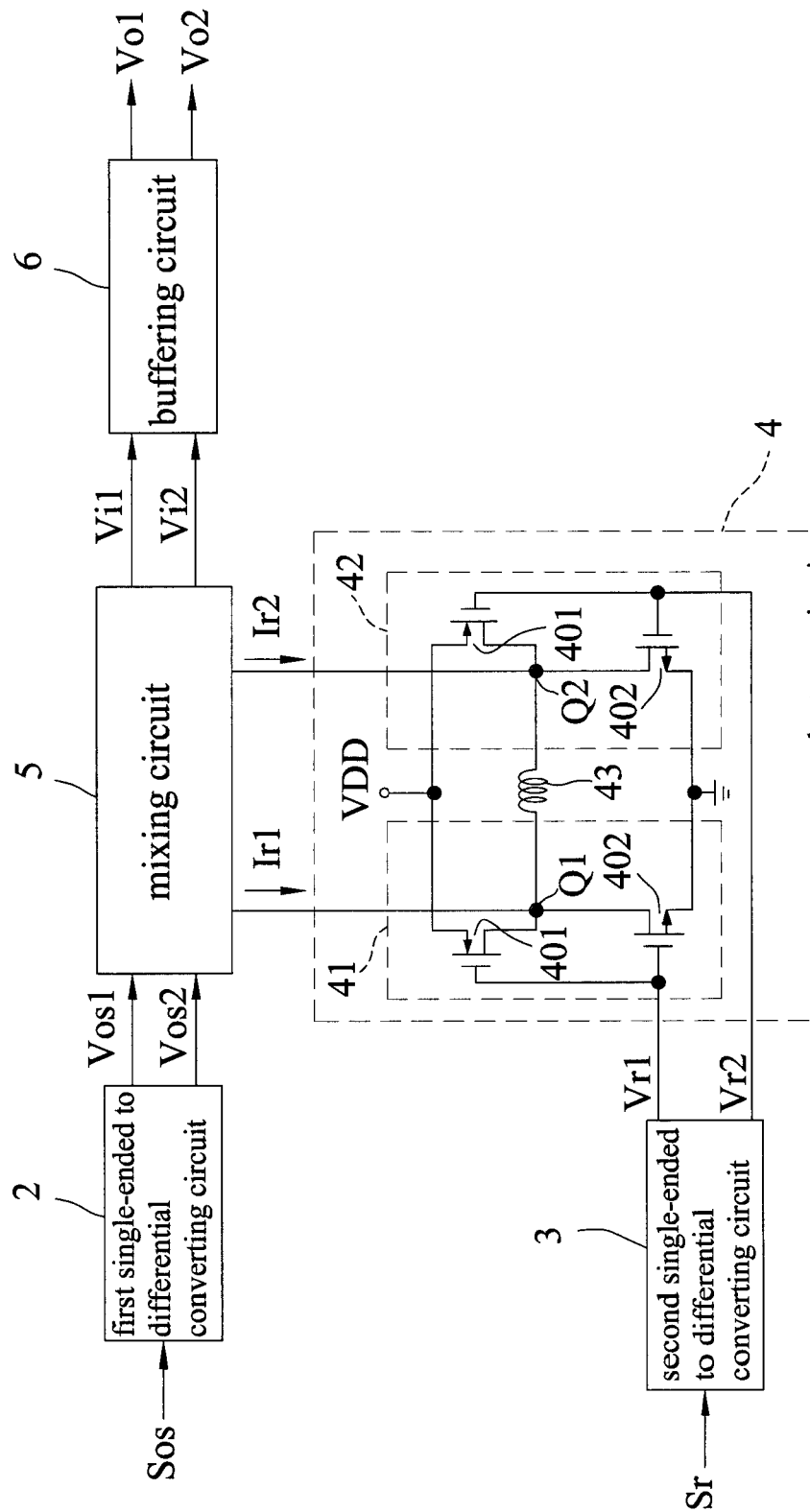
FIGS. 2 and 3 are circuit block diagrams illustrating an embodiment of a down-conversion mixer according to the disclosure.
Figure 3:
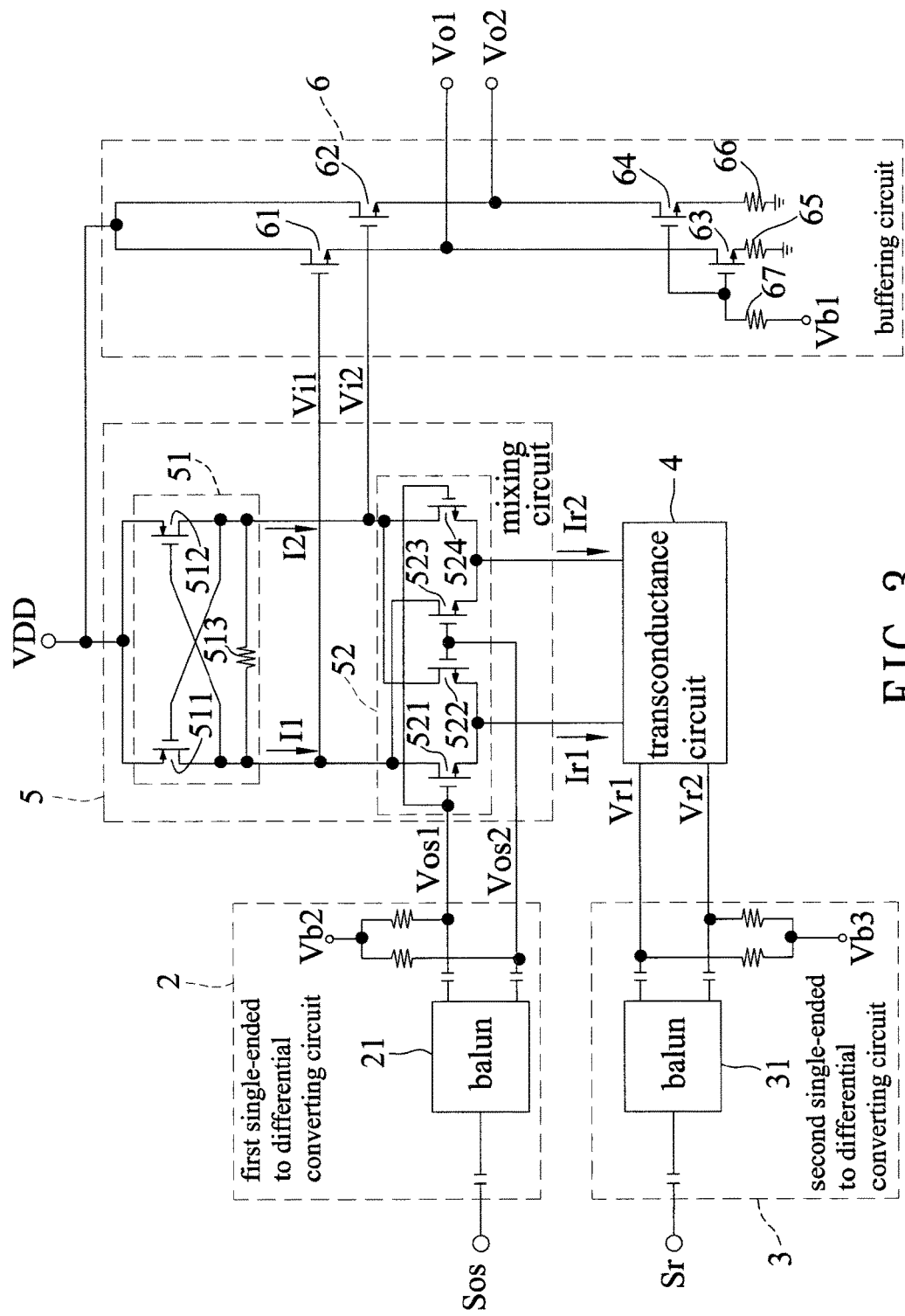

Referring to FIGS. 2 and 3, an embodiment of a down-conversion mixer according to the disclosure includes a first single-ended to differential converting circuit 2, a second single-ended to differential converting circuit 3, a transconductance circuit 4, a mixing circuit 5 and a buffering circuit 6.

The first single-ended to differential converting circuit 2 is for receiving a single-ended oscillatory voltage signal (Sos), and converts the single-ended oscillatory voltage signal (Sos) into a differential oscillatory voltage signal pair that includes a first oscillatory voltage signal (Vos1) and a second oscillatory voltage signal (Vos2).

The second single-ended to differential converting circuit 3 is for receiving a single-ended input voltage signal (Sr) of, for example, radio frequency, and converts the single-ended input voltage signal (Sr) into a differential input voltage signal pair that includes a first input voltage signal (Vr1) and a second input voltage signal (Vr2).

The transconductance circuit 4 is coupled to the second single-ended to differential converting circuit 3 for receiving the differential input voltage signal pair therefrom, and converts the differential input voltage signal pair into a differential input current signal pair that includes a first input current signal (Ir1) and a second input current signal (Ir2).

The mixing circuit 5 is coupled to the first single-ended to differential converting circuit 2 and the transconductance circuit 4 for receiving the differential oscillatory voltage signal pair and the differential input current signal pair respectively therefrom. The mixing circuit 5 mixes the differential input current signal pair with the differential oscillatory voltage signal pair to generate a differential mixed voltage signal pair that includes a first mixed voltage signal (Vi1) and a second mixed voltage signal (Vi2) and that is of, for example, intermediate frequency.

The buffering circuit 6 is coupled to the mixing circuit 5 for receiving the differential mixed voltage signal pair therefrom, and buffers the differential mixed voltage signal pair to generate a differential output voltage signal pair that includes a first output voltage signal (Vo1) and a second output voltage signal (Vo2).

In an example where the single-ended input voltage signal (Sr) has a frequency of 94 GHz, and where the single-ended oscillatory voltage signal (Sos) has a frequency of 93.9 GHz, the differential output voltage signal pair has a frequency of 0.1 GHz.

In this embodiment, as shown in FIG. 3, the first single-ended to differential converting circuit 2 includes a balun 21 (e.g., a Marchand balun) and other elements. The balun 21 has an input terminal that is for receiving a voltage signal related to the single-ended oscillatory voltage signal (Sos), a first output terminal that provides a voltage signal related to the first oscillatory voltage signal (Vos1), and a second output terminal that provides a voltage signal related to the second oscillatory voltage signal (Vos2) . Similarly, the second single-ended to differential converting circuit 3 includes a balun 31 (e.g. ,a Marchand balun) and other elements. The balun 31 has an input terminal that is for receiving a voltage signal related to the single-ended input voltage signal (Sr), a first output terminal that provides a voltage signal related to the first input voltage signal (Vr1), and a second output terminal that provides a voltage signal related to the second input voltage signal (Vr2).

As shown in FIG. 2, the transconductance circuit 4 includes a first transconductance unit 41, a second transconductance unit 42 and an inductor 43. The first transconductance unit 41 is coupled to the second single-ended to differential converting circuit 3 for receiving the first input voltage signal (Vr1) therefrom, and converts the first input voltage signal (Vr1) into the first input current signal (Ir1). Likewise, the second trans conductance unit 42 is coupled to the second single-ended to differential converting circuit 3 for receiving the second input voltage signal (Vr2) therefrom, and converts the second input voltage signal (Vr2) into the second input current signal (Ir2). The inductor 43 is coupled between the first and second transconductance units 41, 42. In this embodiment, the first input current signal (Ir1) is in-phase with the first input voltage signal (Vr1), the second input current signal (Ir2) is in-phase with the second input voltage signal (Vr2), and each of the first and second transconductance units 41, 42 includes two transistors 401, 402. For each of the first and second transconductance units 41, 42, the transistor 401 has a first terminal that is for receiving a supply voltage (VDD), a second terminal that is coupled to the inductor 43, and a control terminal that is coupled to the second single-ended to differential converting circuit 3 for receiving a corresponding one of the first and second input voltage signals (Vr1, Vr2) therefrom; the transistor 402 has a first terminal that is coupled to the second terminal of the transistor 401, a second terminal that is grounded, and a control terminal that is coupled to the control terminal of the transistor 401; and the transistor 402 cooperates with the transistor 401 to provide a corresponding one of the first and second input current signals (Ir1, Ir2) at a common node (Q1/Q2) of the transistors 401, 402 and the inductor 43.

In this embodiment, as shown in FIG. 3, the mixing circuit 5 includes a mixing unit 52 and a load unit 51. The mixing unit 52 is coupled to the first single-ended to differential converting circuit 2 for receiving the differential oscillatory voltage signal pair therefrom, and is coupled further to the common node (Q1) of the transistors 401, 402 of the first transconductance unit 41 and the inductor 43 and to the common node (Q2) of the transistors 401, 402 of the second transconductance unit 42 and the inductor 43 for receiving the differential input current signal pair therefrom. The mixing unit 52 mixes the differential input current signal pair with the differential oscillatory voltage signal pair to generate a differential mixed current signal pair that includes a first mixed current signal (I1) and a second mixed current signal (I2). The load unit 51 is coupled to the mixing unit 52 for receiving the differential mixed current signal pair therefrom, and converts the differential mixed current signal pair into the differential mixed voltage signal pair.

In this embodiment, as shown in FIG. 3, the mixing unit 52 includes four transistors 521-524. The transistor 521 has a first terminal, a second terminal that is coupled to the common node (Q1) , and a control terminal that is coupled to the first single-ended to differential converting circuit 2 for receiving the first oscillatory voltage signal (Vos1) therefrom. The transistor 522 has a first terminal, a second terminal that is coupled to the second terminal of the transistor 521, and a control terminal that is coupled to the first single-ended to differential converting circuit 2 for receiving the second oscillatory voltage signal (Vos2) therefrom. The transistor 522 cooperates with the transistor 521 to receive the first input current signal (Ir1) from the first transconductance unit 41. The transistor 523 has a first terminal that is coupled to the first terminal of the transistor 521, a second terminal that is coupled to the common node (Q2), and a control terminal that is coupled to the control terminal of the transistor 522. The transistor 523 cooperates with the transistor 521 to provide the first mixed current signal (I1) at the first terminal of the transistor 521. The transistor 524 has a first terminal that is coupled to the first terminal of the transistor 522, a second terminal that is coupled to the second terminal of the transistor 523, and a control terminal that is coupled to the control terminal of the transistor 521. The transistor 524 cooperates with the transistor 523 to receive the second input current signal (Ir2) from the second transconductance unit 42, and cooperates with the transistor 522 to provide the second mixed current signal (I2) at the first terminal of the transistor 522.

In this embodiment, as shown in FIG. 3, the load unit 51 includes two transistors 511, 512 and a resistor 513. The transistor 511 has a first terminal that is for receiving the supply voltage (VDD), a second terminal that is coupled to the first terminal of the transistor 521, and a control terminal. The transistor 512 has a first terminal that is coupled to the first terminal of the transistor 511, a second terminal that is coupled to the control terminal of the transistor 511 and the first terminal of the transistor 522, and a control terminal that is coupled to the second terminal of the transistor 511. The resistor 513 is coupled between the second terminals of the transistors 511, 512, cooperates with the transistor 511 to receive the first mixed current signal (I1) from the mixing unit 52, and cooperates with the transistor 512 to receive the second mixed current signal (I2) from the mixing unit 52. The first mixed voltage signal (Vi1) is provided at the second terminal of the transistor 511. The second mixed voltage signal (Vi2) is provided at the second terminal of the transistor 512.

In this embodiment, as shown in FIG. 3, the buffering circuit 6 includes four transistors 61-64 and three resistors 65-67. The transistor 61 has a first terminal that is for receiving the supply voltage (VDD), a second terminal, and a control terminal that is coupled to the second terminal of the transistor 511 for receiving the first mixed voltage signal (Vi1) therefrom. The transistor 62 has a first terminal that is coupled to the first terminal of the transistor 61, a second terminal, and a control terminal that is coupled to the second terminal of the transistor 512 for receiving the second mixed voltage signal (Vi2) therefrom. The resistor 67 has a first terminal that is for receiving a bias voltage (Vb1), and a second terminal. The transistor 63 has a first terminal that is coupled to the second terminal of the transistor 61, a second terminal, and a control terminal that is coupled to the second terminal of the resistor 67 for receiving the bias voltage (Vb1) therethrough. The transistor 64 has a first terminal that is coupled to the second terminal of the transistor 62, a second terminal, and a control terminal that is coupled to the control terminal of the transistor 63. The resistor 65 is coupled between the second terminal of the transistor 63 and ground. The resistor 66 is coupled between the second terminal of the transistor 64 and ground. The first output voltage signal (Vo1) is provided at the second terminal of the transistor 61. The second output voltage signal (Vo2) is provided at the second terminal of the transistor 62.

In this embodiment, each of the transistors 402, 521-524, 61-64 is an N-type metal oxide semiconductor field effect transistor (nMOSFET) having a drain terminal, a source terminal and a gate terminal that respectively serve as the first, second and control terminals of the transistor; and each of the transistors 401, 511, 512 is a P-type metal oxide semiconductor field effect transistor (pMOSFET) having a source terminal, a drain terminal and a gate terminal that respectively serve as the first, second and control terminals of the transistor.

In this embodiment, a conversion gain (CG) of a combination of the transconductance circuit 4 and the mixing circuit 5 can be expressed by the following equation:

$$CG = \frac{2}{\pi} \cdot g_{m(401+402)} \cdot R_L \qquad \text{Equation 2}$$

$$= \frac{2}{\pi} \cdot g_{m(401+402)} \cdot \frac{\frac{-1}{g_{m511,512}} \cdot \frac{R_{513}}{2}}{\frac{-1}{g_{m511,512}} + \frac{R_{513}}{2}}$$

where $g_{m(401+402)}$ denotes a sum of respective transconductances of the transistors 401, 402 of each of the first and second transconductance units 41, 42, $g_{m511,512}$ denotes a transconductance of each of the transistors 511, 512, and $R_{513}$ denotes a resistance of the resistor 513.

In this embodiment, the inductor 43 resonates with the parasitic capacitances of the transistors 401, 402, 521-524 to compensate a frequency pole generated due to the parasitic capacitances of the transistors 401, 402, 521-524, thereby increasing the conversion gain of the combination of the transconductance circuit 4 and the mixing circuit 5, and thus increasing a conversion gain of the down-conversion mixer and reducing a noise figure of the down-conversion mixer. In addition, it is relatively easy to design the parameter ($g_{m(401+402)}$) of this embodiment to be greater than the parameter ($g_{m1, 2}$) of the conventional down-conversion mixer, which is beneficial to increasing the conversion gain of the down-conversion mixer of this embodiment and to reducing the noise figure of the down-conversion mixer of this embodiment. Moreover, a size of each of the transistors 511, 512 can be designed such that the parameter ($R_L$) of this embodiment is greater than the parameter ($R_{1,2}$) of the conventional down-conversion mixer while a voltage drop across each of the transistors 511, 512 of this embodiment is lower than the voltage drop across each of the resistors 141, 142 of the conventional down-conversion mixer, which is beneficial to increasing the conversion gain of the down-conversion mixer of this embodiment and to reducing the noise figure of the down-conversion mixer of this embodiment.

Figure 4:
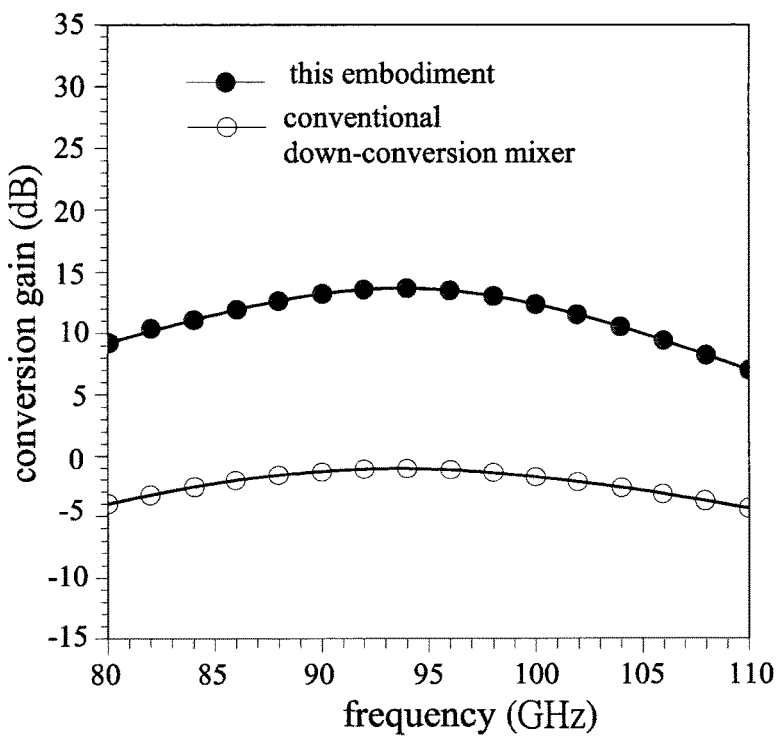
FIG. 4 is a plot illustrating conversion gain versus frequency characteristic for the embodiment and the conventional down-conversion mixer.

FIG. 4 illustrates simulated conversion gain of the down-conversion mixer of this embodiment and simulated conversion gain of the conventional down-conversion mixer under a circumstance where the frequency of the single-ended input voltage signal (Sr) (see FIG. 2) is within a range of 80 GHz to 110 GHz, and where the frequency of the single-ended oscillatory voltage signal (Sos) (see FIG. 2) is lower than that of the single-ended input voltage signal (Sr) (see FIG. 2) by 0.1 GHz. It is known from FIG. 4 that the conversion gain of the down-conversion mixer of this embodiment is higher than that of the conventional down-conversion mixer.

Figure 5:
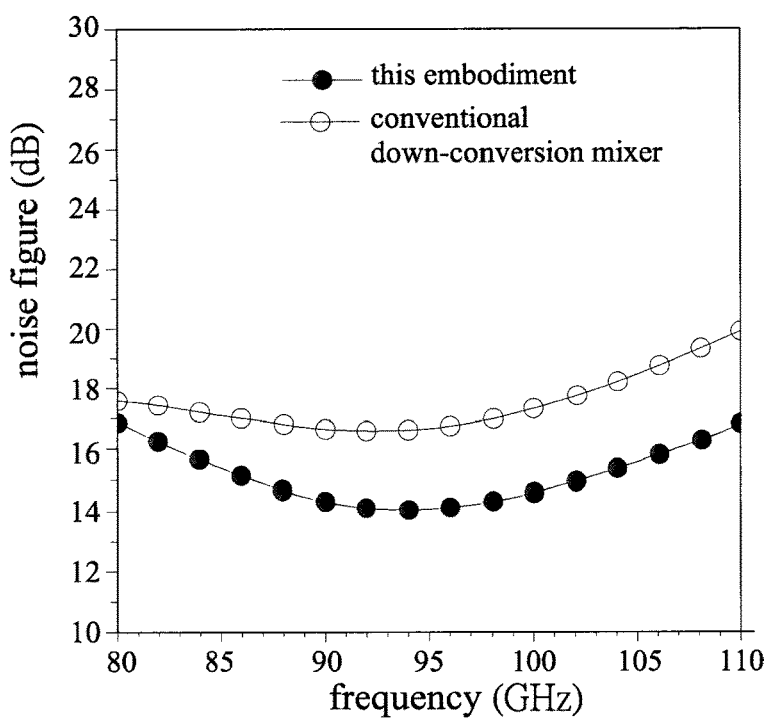
FIG. 5 is a plot illustrating noise figure versus frequency characteristic for the embodiment and the conventional down-conversion mixer.

FIG. 5 illustrates simulated noise figure of the down-conversion mixer of this embodiment and simulated noise figure of the conventional down-conversion mixer under the aforesaid circumstance. It is known from FIG. that the noise figure of the down-conversion mixer of this embodiment is lower than that of the conventional down-conversion mixer.

Referring back to FIGS. 2 and 3, in view of the above, the down-conversion mixer of this embodiment has the following advantages:

1. By virtue of the inductor 43 that resonates with the parasitic capacitances of the transistors 401, 402, 521-524, the conversion gain of the down-conversion mixer can be increased, and the noise figure of the down-conversion mixer can be reduced.

2. By virtue of the transistors 401, 402 of each of the first and second transconductance units 41, 42 that cooperatively convert a corresponding one of the first and second input voltage signals (Vr1, Vr2) into a corresponding one of the first and second input current signals (Ir1, Ir2), the conversion gain of the down-conversion mixer can be further increased, and the noise figure of the down-conversion mixer can be further reduced.

3. By virtue of the cross-coupled transistors 511, 512 that cooperate with the resistor 513 to convert the differential mixed current signal pair into the differential mixed voltage signal pair, the conversion gain of the down-conversion mixer can be further increased, and the noise figure of the down-conversion mixer can be further reduced.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A down-conversion mixer comprising:
   a transconductance circuit including
     a first transconductance unit for receiving a first input voltage signal, and converting the first input voltage signal into a first input current signal,
     a second transconductance unit for receiving a second input voltage signal that cooperates with the first input voltage signal to constitute a differential input voltage signal pair, and converting the second input voltage signal into a second input current signal that cooperates with the first input current signal to constitute a differential input current signal pair, and
     an inductor coupled between said first and second transconductance units; and
   a mixing circuit for receiving a differential oscillatory voltage signal pair, and coupled to a common node of said first transconductance unit and said inductor and to a common node of said second transconductance unit and said inductor for receiving the differential input current signal pair therefrom, said mixing circuit mixing the differential input current signal pair with the differential oscillatory voltage signal pair to generate a differential mixed voltage signal pair;
   wherein said mixing circuit includes
     a mixing unit for receiving the differential oscillatory voltage signal pair, and coupled to said common node of said first transconductance unit and said inductor and to said common node of said second transconductance unit and said inductor for receiving the differential input current signal pair therefrom, said mixing unit mixing the differential input current signal pair with the differential oscillatory voltage signal pair to generate a differential mixed current signal pair, and
     a load unit coupled to said mixing unit for receiving the differential mixed current signal pair therefrom, and converting the differential mixed current signal pair into the differential mixed voltage signal pair;
   wherein the differential mixed current signal pair includes a first mixed current signal and a second mixed current signal;
   wherein the differential mixed voltage signal pair includes a first mixed voltage signal and a second mixed voltage signal;
   wherein said load unit includes
     a first transistor having a first terminal that is for receiving a supply voltage, a second terminal that is coupled to said mixing unit, and a control terminal,
     a second transistor having a first terminal that is coupled to said first terminal of said first transistor, a second terminal that is coupled to said control terminal of said first transistor and said mixing unit, and a control terminal that is coupled to said second terminal of said first transistor, and
     a resistor coupled between said second terminals of said first and second transistors, cooperating with said first transistor to receive the first mixed current signal from said mixing unit, and cooperating with said second transistor to receive the second mixed current signal from said mixing unit;
   wherein the first mixed voltage signal is provided at said second terminal of said first transistor; and
   wherein the second mixed voltage signal is provided at said second terminal of said second transistor.

2. The down-conversion mixer of claim 1, wherein the first input current signal is in-phase with the first input voltage signal, and the second input current signal is in-phase with the second input voltage signal.

3. The down-conversion mixer of claim 1, wherein one of said first and second transconductance units includes:
   a first transistor having a first terminal that is for receiving the supply voltage, a second terminal that is coupled to said inductor and said mixing circuit, and a control terminal that is for receiving a corresponding one of the first and second input voltage signals; and
   a second transistor having a first terminal that is coupled to said second terminal of said first transistor, a second terminal that is grounded, and a control terminal that is coupled to said control terminal of said first transistor, said second transistor cooperating with said first transistor to provide a corresponding one of the first and second input current signals for receipt by said mixing circuit.

4. The down-conversion mixer of claim 1, wherein:
   the differential oscillatory voltage signal pair includes a first oscillatory voltage signal and a second oscillatory voltage signal; and
   said mixing unit includes a first transistor having a first terminal that is coupled to said load unit, a second terminal that is coupled to said common node of said first transconductance unit and said inductor, and a control terminal that is for receiving the first oscillatory voltage signal, a second transistor having a first terminal that is coupled to said load unit, a second terminal that is coupled to said second terminal of said first transistor, and a control terminal that is for receiving the second oscillatory voltage signal, said second transistor cooperating with said first transistor to receive the first input current signal from said first transconductance unit, a third transistor having a first terminal that is coupled to said first terminal of said first transistor, a second terminal that is coupled to said common node of said second transconductance unit and said inductor, and a control terminal that is coupled to said control terminal of said second transistor, said third transistor cooperating with said first transistor to provide the first mixed current signal for receipt by said load unit, and a fourth transistor having a first terminal that is coupled to said first terminal of said second transistor, a second terminal that is coupled to said second terminal of said third transistor, and a control terminal that is coupled to said control terminal of said first transistor, said fourth transistor cooperating with said third transistor to receive the second input current signal from said second transconductance unit, and cooperating with said second transistor to provide the second mixed current signal for receipt by said load unit.

5. The down-conversion mixer of claim 1, further comprising a buffering circuit that is coupled to said mixing circuit for receiving the differential mixed voltage signal pair therefrom, and that buffers the differential mixed voltage signal pair to generate a differential output voltage signal pair.

6. The down-conversion mixer of claim 5, wherein:
the differential output voltage signal pair includes a first output voltage signal and a second output voltage signal;
said buffering circuit includes
a first transistor having a first terminal that is for receiving the supply voltage, a second terminal, and a control terminal that is coupled to said mixing circuit for receiving the first mixed voltage signal therefrom,
a second transistor having a first terminal that is coupled to said first terminal of said first transistor, a second terminal, and a control terminal that is coupled to said mixing circuit for receiving the second mixed voltage signal therefrom,
a third transistor having a first terminal that is coupled to said second terminal of said first transistor, a second terminal, and a control terminal that is for receiving a bias voltage,
a fourth transistor having a first terminal that is coupled to said second terminal of said second transistor, a second terminal, and a control terminal that is coupled to said control terminal of said third transistor,
a first resistor coupled between said second terminal of said third transistor and ground, and
a second resistor coupled between said second terminal of said fourth transistor and ground;
the first output voltage signal is provided at said second terminal of said first transistor; and
the second output voltage signal is provided at said second terminal of said second transistor.

7. The down-conversion mixer of claim 1, further comprising a single-ended to differential converting circuit that is coupled to said mixing circuit, that is for receiving a single-ended oscillatory voltage signal, and that converts the single-ended oscillatory voltage signal into the differential oscillatory voltage signal pair for receipt by said mixing circuit.

8. The down-conversion mixer of claim 7, wherein:
the differential oscillatory voltage signal pair includes a first oscillatory voltage signal and a second oscillatory voltage signal; and
said single-ended to differential converting circuit includes a balun having an input terminal that is for receiving a voltage signal related to the single-ended oscillatory voltage signal, a first output terminal that provides a voltage signal related to the first oscillatory voltage signal, and a second output terminal that provides a voltage signal related to the second oscillatory voltage signal.

9. The down-conversion mixer of claim 1, further comprising a single-ended to differential converting circuit that is coupled to said first and second transconductance units, that is for receiving a single-ended input voltage signal, and that converts the single-ended input voltage signal into the differential input voltage signal pair for receipt by said first and second transconductance units.

10. The down-conversion mixer of claim 9, wherein said single-ended to differential converting circuit includes a balun having an input terminal that is for receiving a voltage signal related to the single-ended input voltage signal, a first output terminal that provides a voltage signal related to the first input voltage signal, and a second output terminal that provides a voltage signal related to the second input voltage signal.

* * * * *